(12) United States Patent
Ng et al.

(10) Patent No.: US 8,003,467 B2
(45) Date of Patent: Aug. 23, 2011

(54) METHOD FOR MAKING A SEMICONDUCTOR DEVICE HAVING METAL GATE STACKS

(75) Inventors: Jin-Aun Ng, Hsinchu (TW); Wen-Chih Yang, Changhua (TW); Chien-Liang Chen, Hsinchu (TW); Chung-Hau Fei, Hsinchu (TW); Maxi Chang, Banciao (TW); Bao-Ru Young, Zhubei (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 82 days.

(21) Appl. No.: 12/433,356

(22) Filed: Apr. 30, 2009

(65) Prior Publication Data
US 2010/0109088 A1 May 6, 2010

Related U.S. Application Data

(60) Provisional application No. 61/110,872, filed on Nov. 3, 2008.

(51) Int. Cl.
*H01L 21/336* (2006.01)

(52) U.S. Cl. ........ 438/285; 438/199; 438/217; 257/369; 257/E21.611

(58) Field of Classification Search .................. 438/199, 438/217, 285; 257/369, E21.611, E27.062
See application file for complete search history.

(56) References Cited

U.S. PATENT DOCUMENTS

| 7,622,341 B2 * | 11/2009 | Chudzik et al. | 438/199 |
| 7,691,698 B2 * | 4/2010 | Chidambarrao et al. | 438/199 |
| 2008/0191243 A1 * | 8/2008 | Liu et al. | 257/190 |

* cited by examiner

*Primary Examiner* — Phuc T Dang
(74) *Attorney, Agent, or Firm* — Haynes and Boone, LLP

(57) ABSTRACT

The present disclosure provides a method including forming STI features in a silicon substrate, defining a first and a second active regions for a PFET and an NFET, respectively; forming a hard mask having an opening to expose the silicon substrate within the first active region; etching the silicon substrate through the opening to form a recess within the first active region; growing a SiGe layer in the recess such that a top surface of the SiGe layer within the first active region and a top surface of the silicon substrate within the second active region are substantially coplanar; forming metal gate material layers; patterning the metal gate material layers to form a metal gate stack on the SiGe layer within the first active region; and forming an eSiGe S/D stressor distributed in both the SiGe layer and the silicon substrate within the first active region.

12 Claims, 6 Drawing Sheets

METHOD FOR MAKING A SEMICONDUCTOR DEVICE HAVING METAL GATE STACKS

PRIORITY DATA

This application claims priority to Provisional Application Ser. No. 61/110,872 filed on Nov. 3, 2008, entitled "A Balance Step-Height Selective Bi-Channel Structure on HKMG Devices," the entire disclosure of which is incorporated herein by reference.

BACKGROUND

When a semiconductor device such as a field-effect transistor (FET) is scaled down through various technology nodes, high k dielectric materials and metals are adopted to form a gate stack. However, the high k and metal gate stack suffers from the high threshold voltage for a p-type FET. Therefore, a semiconductor device and a method of making the same are needed to address the above issue.

SUMMARY

One of the broader forms of an embodiment of the present invention involves a method for making a semiconductor device having metal gate stacks. The method includes forming shallow trench isolation (STI) features in a silicon substrate, defining a first active region configured for a p-type field effect transistor (PFET) and a second active region configured for an n-type field effect transistor (NFET); forming, on the silicon substrate, a hard mask having an opening to expose the silicon substrate within the first active region; etching the silicon substrate through the opening of the hard mask to form a recess in the silicon substrate within the first active region; growing a silicon germanium (SiGe) layer in the recess such that a top surface of the SiGe layer within the first active region and a top surface of the silicon substrate within the second active region are substantially coplanar; forming metal gate material layers on the silicon substrate and the SiGe layer; patterning the metal gate material layers to form a metal gate stack on the SiGe layer within the first active region; and forming an eSiGe source/drain (S/D) stressor distributed in both the SiGe layer and the silicon substrate within the first active region.

Another one of the broader forms of an embodiment of the present invention involves a method for making a semiconductor device having metal gate stacks. The method includes forming shallow trench isolation (STI) features in a silicon substrate, defining a first active region configured for a first p-type field effect transistor (PFET), a second active region configured for an n-type field effect transistor (NFET), and a third active region configured for a second PFET, wherein the third active region has a first dimension less than a second dimension of the first active region; forming, on the silicon substrate, a hard mask having an opening that exposes the silicon substrate within the first active region; etching the silicon substrate through the opening of the hard mask to form a recess in the silicon substrate within the first active region; growing a silicon germanium (SiGe) layer in the recess such that a top surface of the SiGe layer within the first active region and a top surface of the silicon substrate within the second and third active regions are substantially coplanar; forming metal gate material layers on the silicon substrate and the SiGe layer; patterning the metal gate material layers to form a first metal gate stack on the SiGe layer within the first active region and a second metal gate stack on the silicon substrate within the third active region; and forming first source/drain (S/D) features distributed in both the SiGe layer and the silicon substrate within the first active region and second S/D features distributed in the silicon substrate within the third active region.

Yet another one of the broader forms of an embodiment of the present invention involves a semiconductor device. The semiconductor device includes a silicon substrate having a first active region and a second active region; a silicon germanium (SiGe) feature on the silicon substrate within the first active region, the SiGe feature within the first active region and the silicon substrate within the second active region are substantially coplanar; a p-type field effect transistor (PFET) formed in the first active region including: first source/drain (S/D) features distributed in the SiGe feature and the silicon substrate; a first channel in the SiGe layer, disposed between the first S/D features; and a first metal gate stack disposed on the SiGe layer and overlying the first channel; and an n-type field effect transistor (NFET) formed in the second active region including: second source/drain (S/D) features distributed in the silicon substrate; a second channel in the silicon substrate, disposed between the second S/D features; and a second metal gate stack disposed on the silicon substrate, overlying the second channel, and being different from the first metal gate stack in composition.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Particularly.

DETAILED DESCRIPTION

Figure 1:
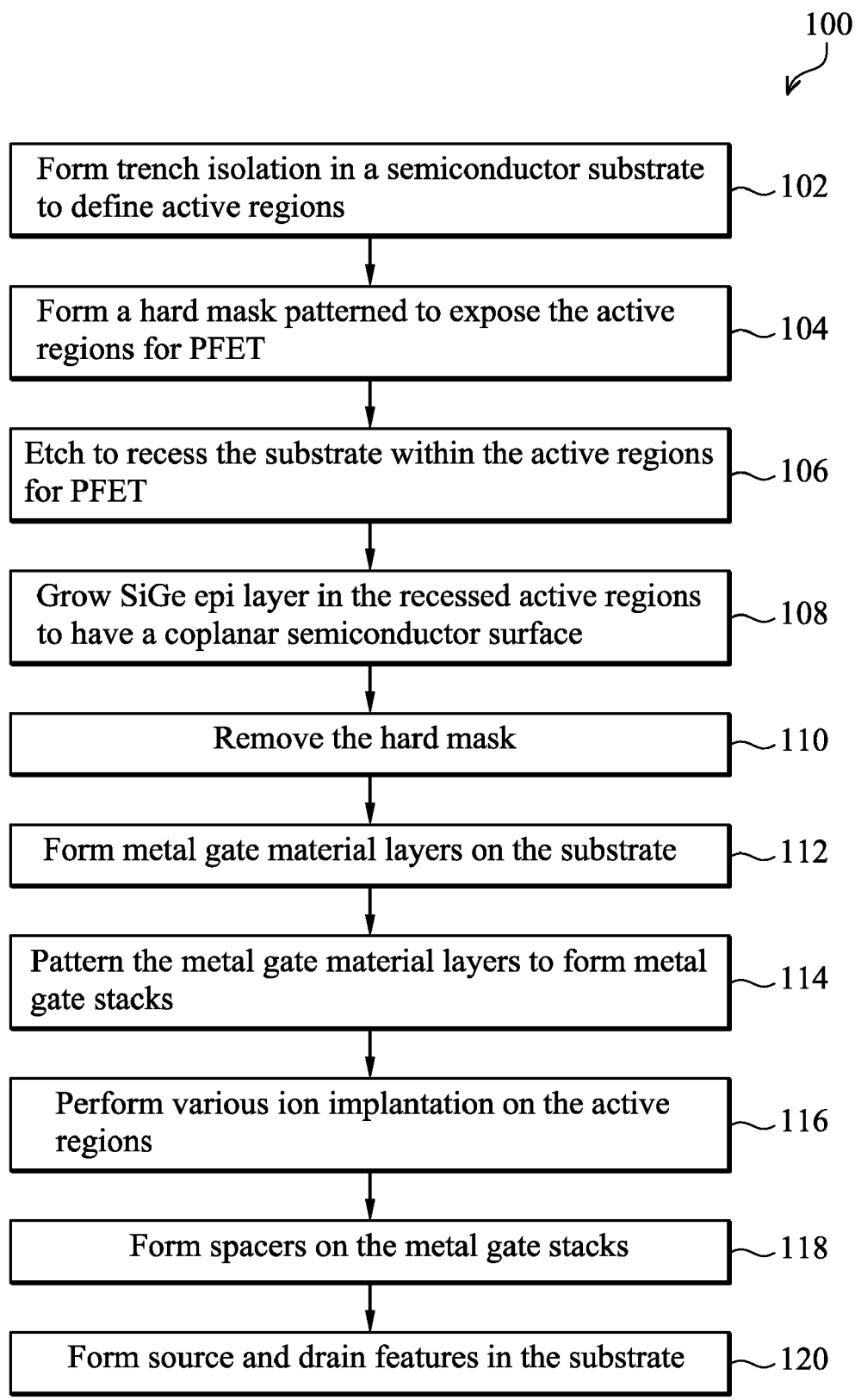
FIG. 1 is a flowchart of a method for making a semiconductor device having a metal gate structure constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device having a metal gate structure constructed according to aspects of the present disclosure. FIGS. 2 through 11 are sectional views of a semiconductor device 200 having a metal gate structure constructed according to aspects of the present disclosure in various embodiments. The semiconductor device 200 and the method 100 of making the same are collectively described below.

Figure 2:
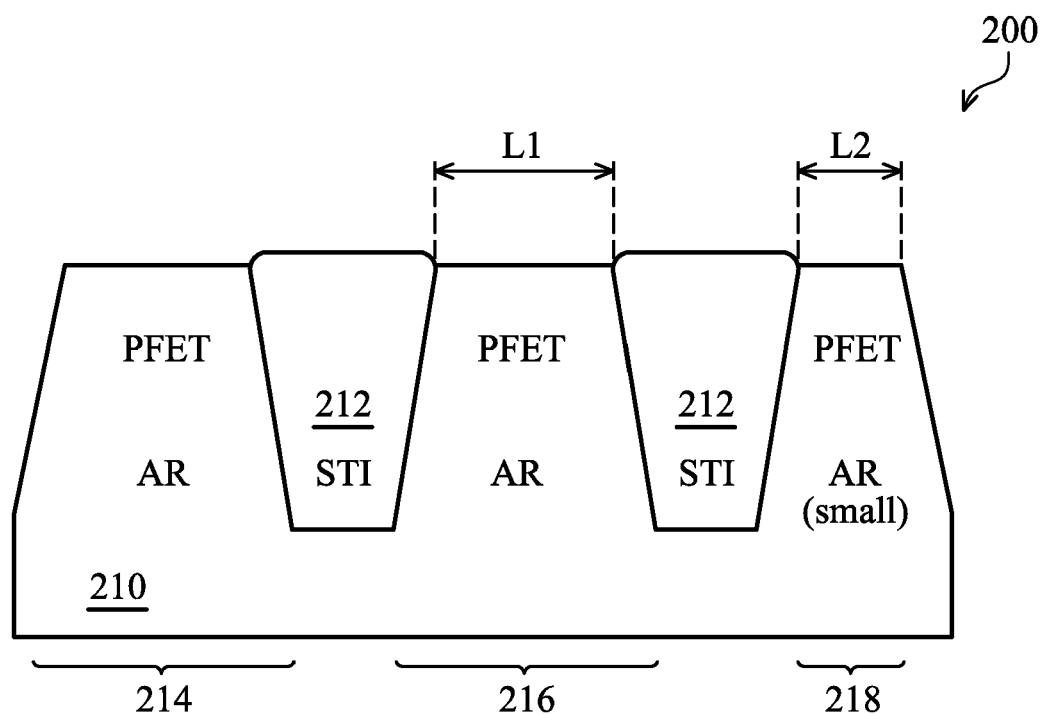
FIGS. 2 through 11 are sectional views of a semiconductor device at various fabrication stages in one or more embodiments of the method of FIG. 1.

Referring to FIGS. 1 and 2, the method 100 begins at step 102 by forming shallow trench isolation (STI) features 212 in a semiconductor substrate 210. The semiconductor substrate 210 includes silicon. The substrate further includes various doped features, such as n type wells and p type wells formed by various ion implantation or diffusion techniques known in the art. The STI features define various active regions. In one embodiment, the substrate includes a first active region 216 configured for a p-type field-effect transistor (PFET) and a second active region 214 configured for an n-type field-effect transistor (NFET). In another embodiment, the substrate 210 additionally includes a third active region 218 configured for a second PFET. The first active region 216 has a dimension L1 greater than a dimension L2 of the third active region 218, as illustrated in FIG. 2. In one example, L2 is about 50% of L1 or less. The STI features 212 can be formed by etching the substrate to form trenches and filling the trenches with one or more dielectric materials. A chemical mechanical polishing (CMP) process may follow thereafter to remove the excess dielectric materials and reduce the surface variation of the substrate. In one example, the STI features 212 include silicon oxide. The silicon oxide can be filled in the trenches by a chemical vapor deposition (CVD) process. In various examples, the silicon oxide can be formed by a high density plasma chemical vapor deposition (HDPCVD). In another embodiment, the trench isolation features may include a multi-layer structure. In furtherance of the embodiment, the trench isolation features include other suitable materials, such as silicon nitride, silicon oxynitride, low k materials, air gap, or combinations thereof. For example, the trench isolation features 218 include a thermal oxide lining layer to improve the trench interface.

Figure 3:
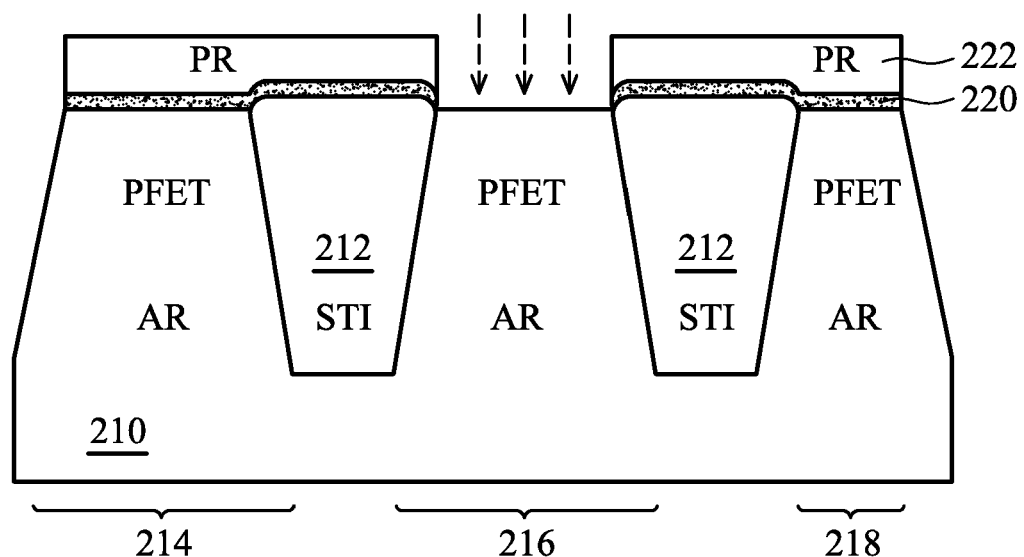

Referring to FIGS. 1 and 3, the method 100 proceeds to step 104 by forming a hard mask 220 patterned to having one or more openings to expose the silicon substrate within the first active region 216. The hard mask 220 may include silicon nitride or other suitable material, such as silicon oxynitride. In another example, the hard mask includes one or more dielectric materials and is formed by a suitable process, such as CVD. In various embodiments, the hard mask layer includes silicon oxide, silicon nitride, silicon oxynitride or a combination thereof in a multi-film structure. In one example, the hard mask 220 has a thickness of about 3 nm. The hard mask 220 can be formed by a procedure including deposition, lithography process and etching. For example, forming a hard mask layer on the substrate and then forming a patterned resist layer 222 on the hard mask layer. The patterned resist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. The etching can be a dry etching process to remove the hard mask layer within the opening of the patterned resist layer in one example. In one embodiment, the second and third active regions are covered by the hard mask. The patterned resist layer is removed thereafter by a process, such as a wet stripping or plasma ashing.

Figure 4:
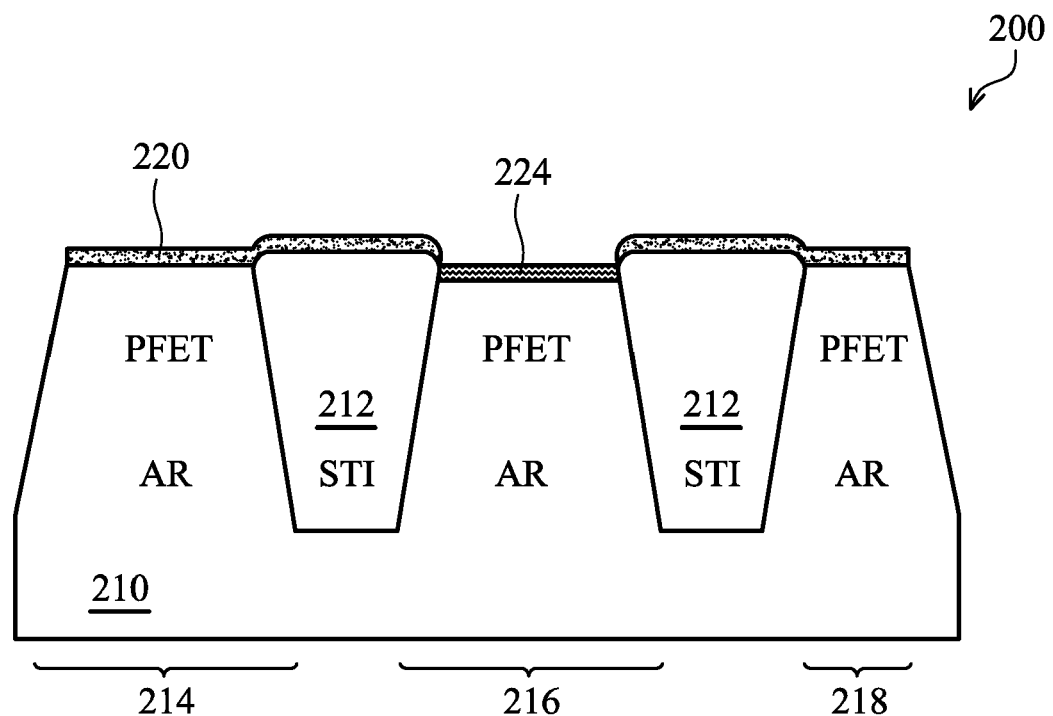

Referring to FIGS. 1 and 4, the method 100 proceeds to step 106 by etching the silicon substrate within the first active region through the opening of hard mask, such that the silicon substrate within the first active region is recessed. In one embodiment, the silicon recess has a depth of about 10 nm. The etching process may include plasma etching utilizing a suitable etchant, such as flurine (F)-containing gas. In various examples, the etchant includes CF4, SF6, NF3, or combinations thereof.

Figure 10:
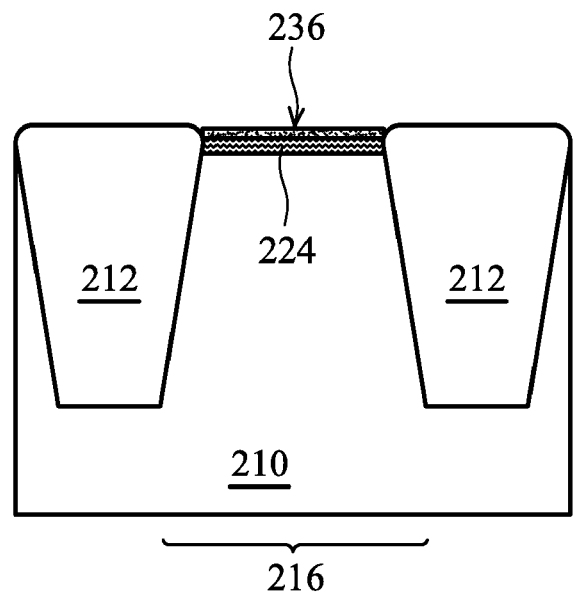
Figure 11:
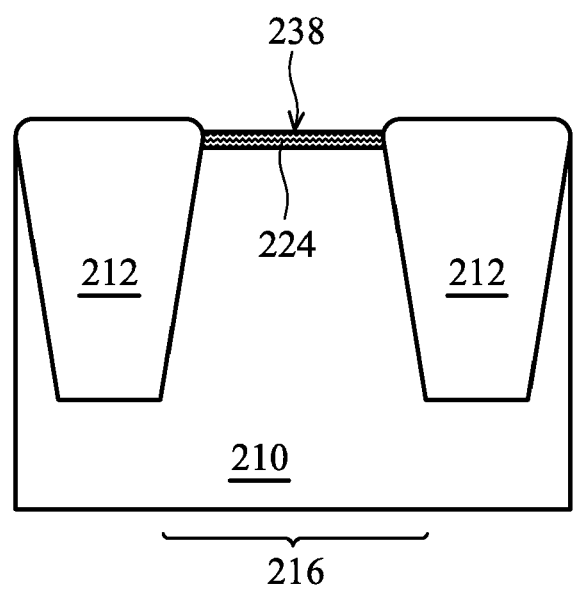

Still referring to FIGS. 1 and 4, the method 100 proceeds to step 108 by growing silicon germanium (SiGe) in the recessed silicon substrate within the first active region by a selective epi growth (SEG) or other suitable epi. technology. The epi grown SiGe layer 224 fills in the silicon recess such that the top surface of the SiGe layer within the first active region and the top surface of the silicon substrate within the second active region are substantially coplanar. In one embodiment, the SiGe layer 224 has a thickness of about 10 nm. In another embodiment, a thin silicon 236 is additionally formed on the SiGe layer 224 by epi growth, as illustrated in FIG. 10. Then an oxidization process is applied to the thin silicon layer 236 to transfer the thin silicon layer into a silicon oxide layer 238 as illustrated in FIG. 11. For example, an oxygen gas and a high temperature are applied to the thin silicon layer 236 to form the silicon oxide layer 238. In one example, such a silicon oxide layer may be formed on the SiGe layer 224 for a low-speed PFET.

Figure 5:
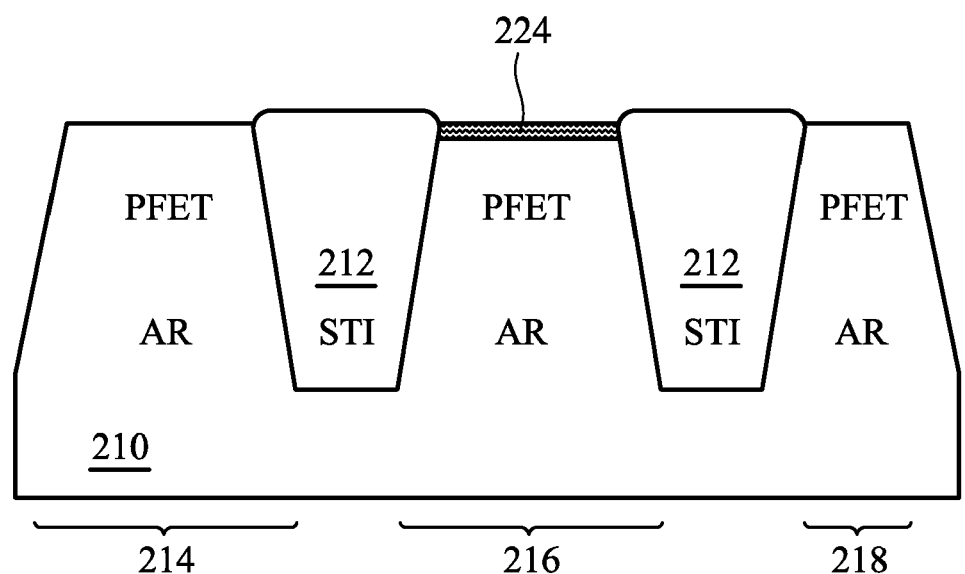

Referring to FIGS. 1 and 5, the method 100 proceeds to step 110 by removing the hard mask. The hard mask layer 220 can be removed by an etching process, such as a wet etch. In one embodiment, a hot phosphoric acid (H3PO4) is used as an ethcant to remove the hard mask of silicon nitride.

Figure 6:
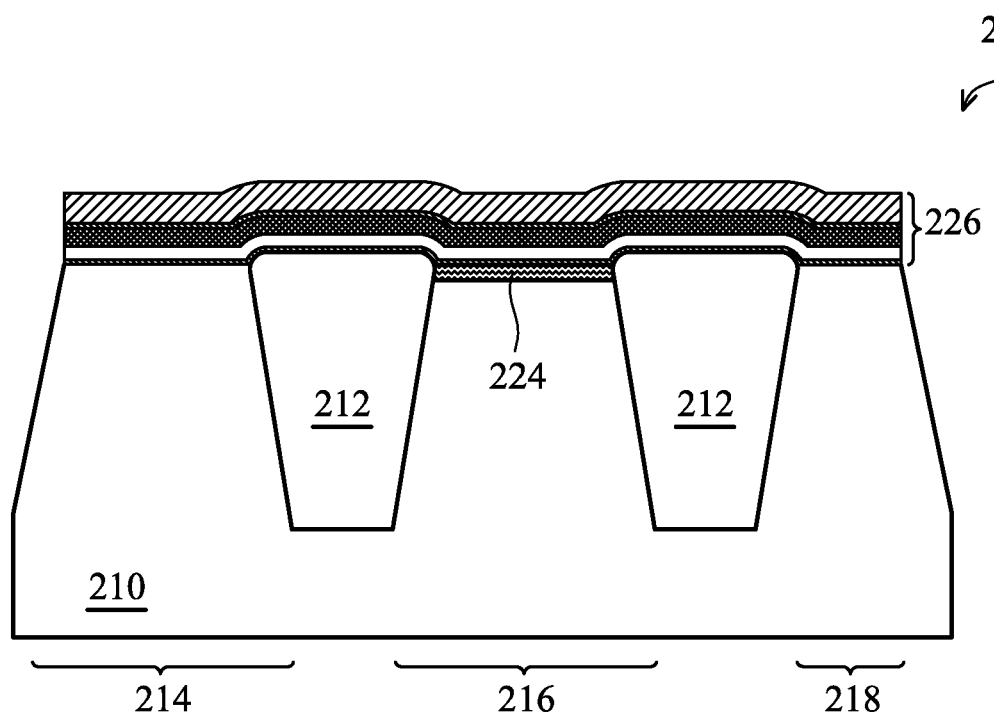

Referring to FIGS. 1 and 6, the method 100 proceeds to step 112 by forming various metal gate material layers 226 on the silicon substrate and the SiGe layer, using various deposition technique such as CVD, atomic layer deposition (ALD) or physical vapor deposition (PVD). The metal gate material layers include a high k dielectric material layer. The high k dielectric material layer is formed by a suitable process such as ALD. Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes hafnium oxide (HfO). Alternatively, the high k dielectric material layer includes metal nitrides, metal silicates or other metal oxides.

An interfacial layer (IL) may be additionally formed on the substrate and is interposed between the SiGe layer and the high k dielectric material layer. The interfacial layer includes a thin silicon oxide layer in one example. In one embodiment, the thin silicon oxide can be formed by the method illustrated in FIGS. 10 and 11. In another embodiment, the thin silicon oxide can be formed by ALD.

The metal gate material layers includes a metal layer formed on the high k dielectric material layer. The metal layer is formed by PVD or other suitable process. In one embodiment, the metal layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer is chosen to have a proper work function for p-type field effect transistor or mid gap work function for both p-type and n-type transistors. In one embodiment, the metal layer has a thickness less than about 50 angstrom. In another embodiment, the metal layer may have a multi-film structure designed to have a proper work function.

The metal gate material layers may include a capping layer interposed between the high k dielectric material layer and the metal layer. In one embodiment, the capping layer includes lanthanum oxide (LaO). The capping layer may alternatively includes other suitable material, such as aluminum oxide (Al2O3). The capping layer can be formed by a suitable process, such as PVD or ALD.

The metal gate material layers further includes a conductive material layer disposed on the metal layer. In one embodiment, the conductive material layer includes doped polysilicon. The polysilicon layer may be formed by a chemical vapor deposition (CVD) process. Silane (SiH4) can be employed a chemical gas in the CVD process to form the silicon layer. In one embodiment, the silicon layer has a thickness less than about 700 angstrom. In another embodiment, the conductive material layer alternatively includes other suitable material, such as copper, aluminum, tungsten, or metal silicide.

Figure 7:
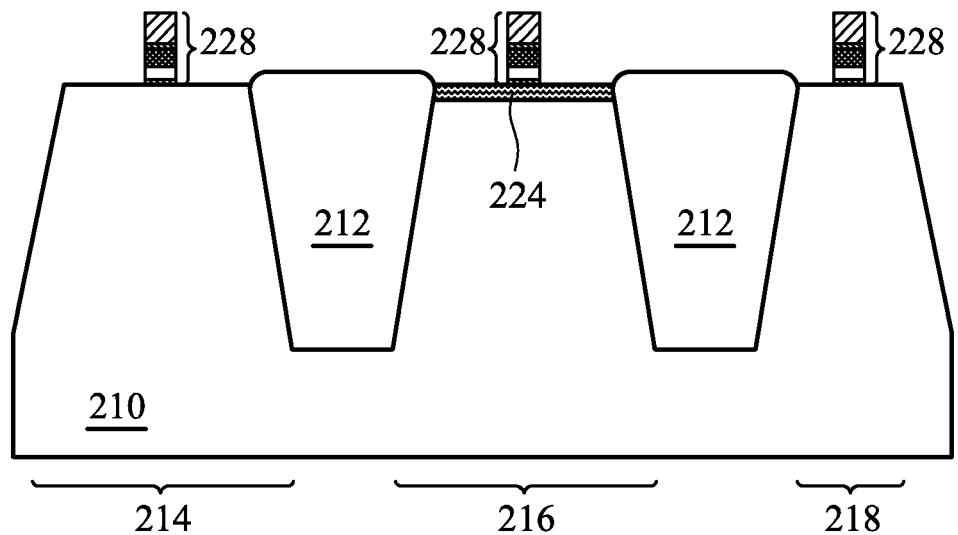

Referring to FIGS. 1 and 7, the method 100 proceeds to step 114 by patterning the various gate material layers to form one or more metal gate stacks 228. For example, a first metal gate stack within the first active region, a second metal gate stack is formed within the second active region and a third metal gate stack is formed within the third active region. The metal gate stacks are formed by an etching procedure using an etch mask.

In one embodiment, the etch mask uses a hard mask of an etch-selective material. In this case, a hard mask layer formed on the conductive material layer. The hard mask layer includes one or more dielectric materials and is formed by a suitable process, such as CVD. In various embodiments, the hard mask layer includes silicon oxide, silicon nitride, silicon oxynitride or a combination thereof in a multi-film structure. A patterned resist layer is formed on the hard mask layer. Then the hard mask layer is etched away within the openings of the patterned resist layer, resulting in a patterned hard mask. The etching process applied to the hard mask layer can be a wet etching process or a dry etching process. For example, a hydrofluoric (HF) solution may be used to etch a silicon oxide hard mask layer. The patterned resist layer is formed by a photolithography process.

In another embodiment, the hard mask layer may be avoid. In this case, the etch mask can be a patterned resist layer formed on the metal gate material layers, defining one or more openings of the resist layer. The metal gate layers are patterned by directly forming the patterned resist layer on the conductive material layer and then etching the metal gate material layers through the openings of the patterned resist layer.

The etching procedure involves one or more wet or dry etchings to effectively remove the various metal gate material layers within the openings of the etch mask. In one embodiment, the etching procedure utilizes a dry etching process. In one example, the dry etching process implements a fluorine-containing plasma to remove the silicon layer. In another example, the dry etching process with the fluorine-containing plasma is implemented to remove the polysilicon layer, the metal layer and the high k dielectric material layer. Alternatively, the etching process may include multiple etching steps to etch the various gate material layers.

Figure 8:
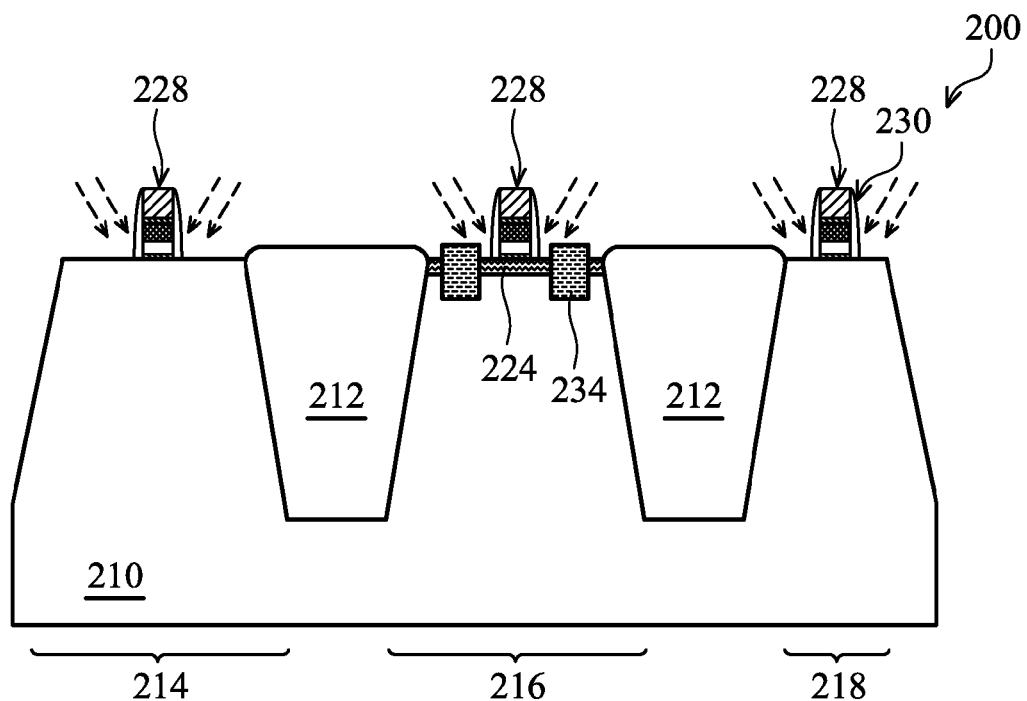

Referring to FIGS. 1 and 8, the method 100 may proceed to step 116 by performing various ion implantations. In one embodiment, a dielectric layer 230 is formed on the sidewalls of the metal gate stacks 228. The dielectric layer 230 is disposed on the sidewalls of the metal gate stack such that the subsequent ion implantation are offset from the metal gate stack for better device performance. Additionally or alternatively, the dielectric layer can function to seal the high k dielectric material layer and the metal layer, therefore protecting these gate materials. The dielectric layer 230 includes silicon oxide, silicon nitride or other suitable dielectric material. The dielectric layer 230 can be formed by CVD, PVD or other suitable process.

Still referring to FIG. 8, various ion implantations are performed to the silicon substrate 210 and/or the SiGe layer 224. In one embodiment, a light doped drain (LDD) regions are formed by an ion implantation process using the gate stack as an implanting mask. The LDD regions are substantially aligned with the edges of the gate stack. If the dielectric layer is present, the LDD regions are offset from the edge of the gate stack by the dielectric layer. Additionally, a halo/pocket implantation process may be implemented to eliminate the short channel effect.

Particularly, an epi silicon germanium source/drain (eSiGe S/D) stressor 234 are formed in the first active region by an ion implantation. The eSiGe S/D stressor 234 is configured in the first active region for the strain effect to enhance the mobility in the channel region. The eSiGe S/D stressor 234 is a doped feature vertically distributed in both the SiGe layer and the silicon substrate. In one embodiment, the eSiGe S/D stressor is an additional doped feature with implanted ions, such as silicon, germanium, boron, gallium or combinations thereof. In another embodiment, the eSiGe S/D stressor may include the LDD and/or the halo doped features in the first active region.

Figure 9:
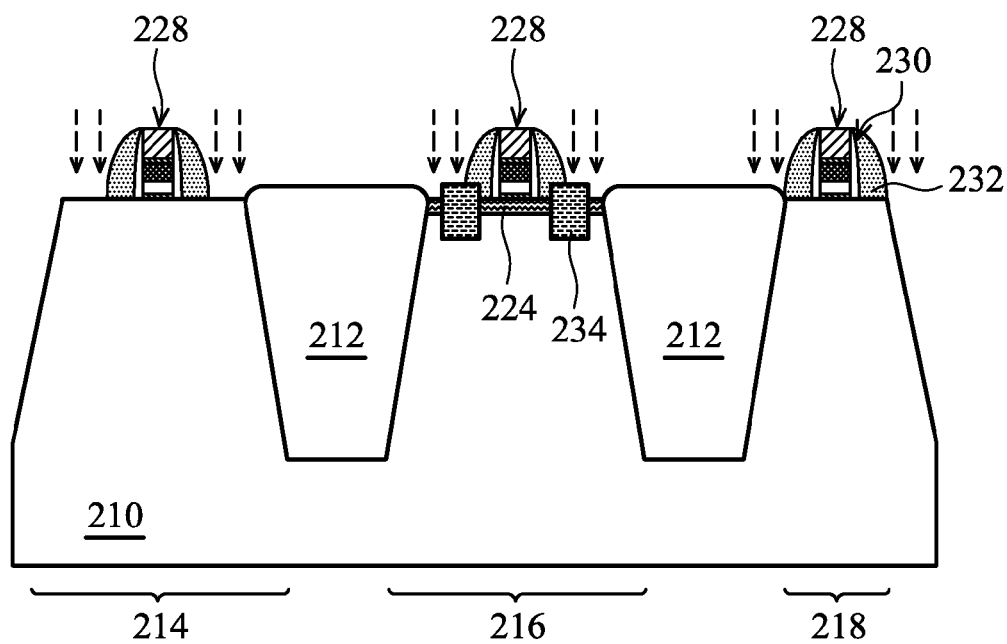

Referring to FIGS. 1 and 9, the method 100 may proceed to step 118 by forming a spacer 232. The spacer 232 is formed on the sidewalls of the gate stack (or the sidewalls of the dielectric layer if present) by a technique known in the art. For example, the spacer includes silicon nitride and is formed by a chemical vapor deposition (CVD) and then a dry etching process. The spacer 232 may have a multiple-layer structure.

Still referring to FIGS. 1 and 9, the method 100 may proceed to step 120 by forming source and drain features using another ion implantation process. Thus formed source and drain are further offset from the gate stack by the spacer 232. An annealing process may be applied thereafter to the substrate to activate the source/drain features and/or other doped features performed at step 116. The annealing process can be implemented by a suitable method, such as rapid thermal annealing or laser annealing. In another embodiment, the eSiGe S/D stressor 234 includes S/D features.

Thus formed semiconductor device 200 includes a PFET that has the SiGe layer coplanar with the silicon substrate within the second active region. Additionally, the PFET has a channel defined in the SiGe layer with enhanced mobility. The PFET further includes the eSiGe stressor formed in the first active region and distributed vertically in both the SiGe layer and the silicon substrate underlying the SiGe layer. The threshold voltage of the PFET can be reduced by the disclosed structure.

Although not shown, other processing step may present to form various devices features such as multilayer interconnection (MLI) and interlayer dielectric (ILD). In one embodiment, the multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

Other processing steps may follow to form other features of the semiconductor device 200 after the method 100. For example, an ILD layer is formed on the substrate and the gate stacks, then a CMP process is applied to the substrate, and then the contacts to the source/drain and the gates are formed in the ILD.

The present disclosure is not limited to applications in which the semiconductor structure includes a MOS transistor, and may be extended to other integrated circuit having a dynamic random access memory (DRAM) cell, a single electron transistor (SET), and/or other microelectronic devices (collectively referred to herein as microelectronic devices). In another embodiment, the semiconductor device 200 includes FinFET transistors. Of course, aspects of the present disclosure are also applicable and/or readily adaptable to other type of transistor, such multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In another embodiment, the SiGe layer may be additionally formed in the PFET within the small active region, such as the third active region 218. In another embodiment, a silicon carbide (SiC) epi layer is formed similar in the second active region for the NFET such that the NFET channel is formed in the SiC layer and the mobility of the BFET channel is enhanced. In another embodiment, the metal gate stack for the NFET in the second active region is different from the metal gate stack for the PFET in the first active region in term of composition. For example, the metal layer in the metal gate stack of the NFET uses different metal material such that the work function can be properly tuned for the PFET. In another embodiment, the substrate may include a semiconductor-on-insulator (SOI) structure such as a buried dielectric layer.

In another embodiment, the various gate stacks may be formed by a hybrid approach wherein one type of stacks are formed by a gate-first approach and the another type gate stacks are formed by a gate-last approach. In another embodiment, the NFET is formed by a gate-last process.

Thus, the present disclosure provides a method for making an integrated circuit having metal gate stacks. The method includes forming shallow trench isolation (STI) features in a silicon substrate, defining a first active region configured for a p-type field effect transistor (PFET) and a second active region configured for an n-type field effect transistor (NFET); forming, on the silicon substrate, a hard mask designed having an opening to expose the silicon substrate within the first active region; etching the silicon substrate through the opening of the hard mask to form a recess in the silicon substrate within the first active region; growing a silicon germanium (SiGe) layer on the silicon substrate within the first active region such that a top surface of the SiGe layer within the first active region and a top surface of the silicon substrate within the second active region are substantially coplanar; forming metal gate material layers on the silicon substrate and the SiGe layer; patterning the metal gate material layers to form a metal gate stack on the SiGe layer within the first active region; and forming an eSiGe source/drain stressor distributed in both the SiGe layer and the silicon substrate within the first active region.

In various embodiments, the disclosed method further includes forming a first dielectric layer on the metal gate stack; forming light-doped drain (LDD) features in the SiGe layer; and forming a spacer on sidewall of the first dielectric layer before forming of the eSiGe S/D stressor. The method further include applying at least one of pocket and halo implantations to the SiGe layer within the first active region before the forming of the spacer. The forming of the metal gate material layers includes forming a high k dielectric layer; forming a metal layer on the high k dielectric layer; and forming a conductive layer on the metal layer. The conductive layer may include doped polysilicon. The method may further include forming a thin silicon layer on the SiGe layer by epi growth; and implementing an oxidization process to the thin silicon layer to transfer the thereof into a silicon oxide layer before the forming of the metal gate material layers. The method may further include removing the hard mask after the growing the SiGe layer.

The present disclosure also provide a method for making a semiconductor device having metal gate stacks in another embodiment. The method includes forming shallow trench isolation (STI) features in a silicon substrate, defining a first active region configured for a p-type field effect transistor (PFET), a second active region configured for an n-type field effect transistor (NFET), and a third active region configured for a second PFET, wherein the third active region has a first dimension less than a second dimension of the first active region; forming, on the silicon substrate, a hard mask patterned to have an opening to expose the silicon substrate within the first active region; etching the silicon substrate through the opening of the hard mask to form a recess in the silicon substrate within the first active region; growing a silicon germanium (SiGe) layer on the silicon substrate within the first active region such that a top surface of the SiGe layer within the first active region and a top surface of the silicon substrate within the second and third active regions are substantially coplanar; forming metal gate material layers on the silicon substrate and the SiGe layer; patterning the metal gate material layers to form a first metal gate stack on the SiGe layer within the first active region and a second metal gate stack on the silicon substrate within the third active region; and forming first source/drain (S/D) features distributed in both the SiGe layer and the silicon substrate within the first active region and second S/D features distributed in the silicon substrate within the third active region.

The method may further include forming a first dielectric layer on the metal gate stack; thereafter forming light-doped drain (LDD) features in the SiGe layer; and forming a spacer on sidewall of the first dielectric layer before forming of the first and second S/D features. The method may further include applying a halo ion implantation to the SiGe layer within the first active region before the forming of the spacer. The forming of the metal gate material layers may include forming a high k dielectric layer; forming a capping layer on the high k dielectric layer; forming a metal layer on the high k dielectric layer; and forming a conductive layer on the metal layer. The method may further include forming a second hard mask on the silicon substrate patterned to have an opening exposing the silicon substrate within the second active region; etching the silicon substrate within the second active region through the opening of second hard mask; and growing a silicon carbide (SiC) layer on the silicon substrate within the second active region such that the SiC layer and the SiGe layer are substantially coplanar. The method may further include removing the second hard mask after the growing of the SiC layer. The method of may further include forming second metal gate layers on the SiC layer, the second metal gate layers are different from the metal gate layers in composition; and patterning the second metal gate layers to form a second metal gate stack on the SiC layer within the second active region.

The present disclosure also provides a semiconductor device including a silicon substrate having a first active region and a second active region; a silicon germanium (SiGe) feature on the silicon substrate within the first active region, the SiGe feature within the first active region and the silicon substrate within the second active region are substantially coplanar; a p-type field effect transistor (PFET) formed in the first active region; and an n-type field effect transistor (NFET) formed in the second active region. The PFET includes first source/drain (S/D) features distributed in the SiGe feature and the silicon substrate; a first channel in the SiGe layer, disposed between the first S/D features; and a first metal gate stack disposed on the SiGe layer and overlying the first channel. The NFET includes second source/drain (S/D) features distributed in the silicon substrate; a second channel in the silicon substrate, disposed between the second S/D features; and a second metal gate stack disposed on the silicon substrate, overlying the second channel, and being different from the first metal gate stack in composition.

The device may further include a dielectric layer disposed on sidewalls of the first metal gate stack; and a spacer disposed on the dielectric layer. The device may further include a second PFET formed in a third active region, wherein the silicon substrate within the third active region has a top surface substantially coplanar to a top surface of the SiGe layer within the first active region, the third active region has a first dimension less then a second dimension of the first active region. The second PFET includes third source/drain (S/D) features distributed in the SiGe feature and the silicon substrate; a third channel in the silicon substrate, disposed between the third S/D features; and a third metal gate stack disposed on the silicon substrate layer and overlying the third channel, the third metal gate stack being substantially similar to the first metal gate stack in composition. The first and third metal gate stack may include a silicon oxide layer; a high k dielectric material layer on the silicon oxide layer; a first metal layer on the high k dielectric material layer; and a conductive layer on the first metal layer. The second metal gate stack may include the silicon oxide layer; the high k dielectric material layer on the silicon oxide layer; a second metal layer on the high k dielectric material layer, the second metal layer being different from the first metal layer in composition; and the conductive layer on the second metal layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device having metal gate stacks comprising:
    forming shallow trench isolation (STI) features in a silicon substrate, defining a first active region configured for a p-type field effect transistor (PFET) and a second active region configured for an n-type field effect transistor (NFET);
    forming, on the silicon substrate, a hard mask having an opening to expose the silicon substrate within the first active region;
    etching the silicon substrate through the opening of the hard mask to form a recess in the silicon substrate within the first active region;
    growing a silicon germanium (SiGe) layer in the recess such that a top surface of the SiGe layer within the first active region and a top surface of the silicon substrate within the second active region are substantially coplanar;
    forming metal gate material layers on the silicon substrate and the SiGe layer;
    patterning the metal gate material layers to form a metal gate stack on the SiGe layer within the first active region;
    forming an eSiGe source/drain (S/D) stressor distributed in both the SiGe layer and the silicon substrate within the first active region;
    forming a first dielectric layer on the metal gate stack;
    forming light-doped drain (LDD) features in the SiGe layer; and
    forming a spacer on sidewall of the first dielectric layer prior to forming of the eSiGe S/D stressor.

2. The method of claim 1, further comprising applying at least one of a pocket implantation and a halo implantation to the SiGe layer within the first active region prior to forming of the spacer.

3. A method for making a semiconductor device having metal gate stacks comprising:
    forming shallow trench isolation (STI) features in a silicon substrate, defining a first active region configured for a p-type field effect transistor (PFET) and a second active region configured for an n-type field effect transistor (NFET);
    forming, on the silicon substrate, a hard mask having an opening to expose the silicon substrate within the first active region;
    etching the silicon substrate through the opening of the hard mask to form a recess in the silicon substrate within the first active region;
    growing a silicon germanium (SiGe) layer in the recess such that a top surface of the SiGe layer within the first active region and a top surface of the silicon substrate within the second active region are substantially coplanar;
    forming metal gate material layers on the silicon substrate and the SiGe layer;
    patterning the metal gate material layers to form a metal gate stack on the SiGe layer within the first active region; and
    forming an eSiGe source/drain (S/D) stressor distributed in both the SiGe layer and the silicon substrate within the first active region, wherein the forming of the metal gate material layers comprises:
    forming a high k dielectric layer;
    forming a metal layer on the high k dielectric layer; and
    forming a conductive layer on the metal layer.

4. The method of claim 3, wherein the conductive layer comprises doped polysilicon.

5. A method for making a semiconductor device having metal gate stacks comprising:
    forming shallow trench isolation (STI) features in a silicon substrate, defining a first active region configured for a p-type field effect transistor (PFET) and a second active region configured for an n-type field effect transistor (NFET);
    forming, on the silicon substrate, a hard mask having an opening to expose the silicon substrate within the first active region;
    etching the silicon substrate through the opening of the hard mask to form a recess in the silicon substrate within the first active region;
    growing a silicon germanium (SiGe) layer in the recess such that a top surface of the SiGe layer within the first active region and a top surface of the silicon substrate within the second active region are substantially coplanar;

forming metal gate material layers on the silicon substrate and the SiGe layer;

patterning the metal gate material layers to form a metal gate stack on the SiGe layer within the first active region;

forming an eSiGe source/drain (S/D) stressor distributed in both the SiGe layer and the silicon substrate within the first active region;

forming a thin silicon layer on the SiGe layer by epi growth; and implementing an oxidization process to transform the thin silicon layer into a silicon oxide layer prior to forming of the metal gate material layers.

6. A method for making a semiconductor device having metal gate stacks comprising:

forming shallow trench isolation (STI) features in a silicon substrate, defining a first active region configured for a first p-type field effect transistor (PFET), a second active region configured for an n-type field effect transistor (NFET), and a third active region configured for a second PFET, wherein the third active region has a first dimension less than a second dimension of the first active region;

forming, on the silicon substrate, a hard mask having an opening that exposes the silicon substrate within the first active region;

etching the silicon substrate through the opening of the hard mask to form a recess in the silicon substrate within the first active region;

growing a silicon germanium (SiGe) layer in the recess such that a top surface of the SiGe layer within the first active region and a top surface of the silicon substrate within the second and third active regions are substantially coplanar;

forming metal gate material layers on the silicon substrate and the SiGe layer;

patterning the metal gate material layers to form a first metal gate stack on the SiGe layer within the first active region and a second metal gate stack on the silicon substrate within the third active region; and forming first source/drain (S/D) features distributed in both the SiGe layer and the silicon substrate within the first active region and second S/D features distributed in the silicon substrate within the third active region.

7. The method of claim 6, further comprising forming a first dielectric layer on the first metal gate stack;

thereafter forming light-doped drain (LDD) features in the SiGe layer; and forming a spacer on sidewall of the first dielectric layer prior to forming of the first and second S/D features.

8. The method of claim 6, further comprising applying a halo ion implantation to the SiGe layer within the first active region prior to forming of the spacer.

9. The method of claim 6, wherein the forming of the metal gate material layers comprising:

forming a high k dielectric layer;

forming a capping layer on the high k dielectric layer;

forming a metal layer on the high k dielectric layer; and forming a conductive layer on the metal layer.

10. The method of claim 6, further comprising:

forming a second hard mask on the silicon substrate patterned to have an opening exposing the silicon substrate within the second active region;

etching the silicon substrate within the second active region through the opening of second hard mask to form a second recess in the silicon substrate within the second active region; and growing a silicon carbide (SiC) layer in the second recess such that the SiC layer and the SiGe layer are substantially coplanar.

11. The method of claim 10, further comprising removing the second hard mask after the growing of the SiC layer.

12. The method of claim 10, further comprising:

forming second metal gate layers on the SiC layer, the second metal gate layers are different from the metal gate layers in composition; and patterning the second metal gate layers to form a second metal gate stack on the SiC layer within the second active region.

\* \* \* \* \*